United States Patent
Hecht

(10) Patent No.: US 7,190,935 B2
(45) Date of Patent: Mar. 13, 2007

(54) AMPLIFIER POWER DETECTION CIRCUITRY

(75) Inventor: James Burr Hecht, Cedar Rapids, IA (US)

(73) Assignee: RF Micro Devices, Inc., Greensboro, NC (US)

( * ) Notice: Subject to any disclaimer, the term of this patent is extended or adjusted under 35 U.S.C. 154(b) by 910 days.

(21) Appl. No.: 09/952,524

(22) Filed: Sep. 14, 2001

(65) Prior Publication Data

US 2003/0054778 A1   Mar. 20, 2003

(51) Int. Cl.
 *H04B 1/04* (2006.01)
(52) U.S. Cl. .............................. 455/127.1; 455/234.1; 455/423; 455/425; 323/222; 324/95; 330/285; 375/297
(58) Field of Classification Search ............. 455/234.1, 455/234.2, 235.1, 240.1, 243.1, 245.1, 245.2, 455/247.1, 250.1, 251.1, 253.2, 126, 127.1, 455/414.1, 423, 425; 342/92, 93; 375/345, 375/297; 323/222; 324/95; 330/129, 134, 330/251, 254, 285, 289
See application file for complete search history.

(56) References Cited

U.S. PATENT DOCUMENTS

| | | | | |
|---|---|---|---|---|
| 3,109,992 A | 11/1963 | Elliott | ......................... | 329/178 |
| 3,449,680 A | 6/1969 | Schilb et al. | .................. | 330/11 |
| 4,122,400 A | 10/1978 | Medendorp et al. | ..... | 330/207 P |
| 4,233,474 A | 11/1980 | Hishinuma et al. | ....... | 179/81 B |
| 4,523,155 A | 6/1985 | Walczak et al. | ............ | 330/279 |
| 4,924,194 A * | 5/1990 | Opas et al. | .................. | 330/289 |
| 5,122,760 A * | 6/1992 | Nishijima | .................... | 330/254 |
| 5,126,688 A * | 6/1992 | Nakanishi et al. | .......... | 330/285 |
| 5,138,274 A * | 8/1992 | Nakanishi et al. | .......... | 330/136 |
| 5,196,806 A * | 3/1993 | Ichihara | ....................... | 330/137 |
| 5,337,006 A * | 8/1994 | Miyazaki | ..................... | 330/130 |
| 5,367,268 A * | 11/1994 | Baba | ........................... | 330/129 |
| 5,629,648 A | 5/1997 | Pratt | ........................... | 330/289 |
| 5,678,209 A * | 10/1997 | Strakovsky | .................. | 455/126 |
| 5,854,971 A * | 12/1998 | Nagoya et al. | .............. | 455/126 |
| 5,898,337 A * | 4/1999 | Inahasi | ......................... | 330/134 |
| 5,923,153 A * | 7/1999 | Liu | .............................. | 323/222 |
| 5,956,627 A * | 9/1999 | Goos | ........................ | 455/127.1 |
| 6,084,920 A * | 7/2000 | Ferdinandsen | .............. | 375/297 |
| 6,108,527 A | 8/2000 | Urban et al. | ................. | 455/115 |

(Continued)

FOREIGN PATENT DOCUMENTS

EP       0 527 617 A2     7/1993

(Continued)

OTHER PUBLICATIONS

Motorola datasheet: "Advanced Mobile Phone System," 68P81039E25-A, Aug. 1979.

*Primary Examiner*—Gerald Gauthier
(74) *Attorney, Agent, or Firm*—Withrow & Terranova, PLLC

(57) ABSTRACT

The present invention provides an efficient way to detect the transmit power provided by an amplifier. A power sense signal indicative of the transmit power of the amplifier is generated and fed back to a control system, which will react accordingly to control input signal levels, bias, gain, or a combination thereof for the amplifier in traditional fashion to control transmit power. Detection circuitry representing a scaled version of the amplifier receives the radio frequency (RF) drive in parallel with the amplifier to provide a scaled output signal. The scaled output signal is rectified and filtered to generate the power sense signal.

30 Claims, 6 Drawing Sheets

U.S. PATENT DOCUMENTS

| | | | |
|---|---|---|---|
| 6,211,735 B1 * | 4/2001 | Luu | 330/251 |
| 6,262,630 B1 * | 7/2001 | Eriksson | 330/129 |
| 6,272,336 B1 * | 8/2001 | Appel et al. | 455/423 |
| 6,434,374 B1 * | 8/2002 | Muterspaugh | 455/234.1 |
| 6,528,983 B1 * | 3/2003 | Augustine | 324/95 |
| 6,624,702 B1 * | 9/2003 | Dening | 330/297 |
| 6,822,515 B2 * | 11/2004 | Ichitsubo et al. | 330/285 |

FOREIGN PATENT DOCUMENTS

| | | |
|---|---|---|
| WO | WO 01/56176 A2 | 8/2001 |

* cited by examiner

AMPLIFIER POWER DETECTION CIRCUITRY

FIELD OF THE INVENTION

The present invention generally relates to radio frequency power amplifiers, and in particular to determining the output power provided by an amplifier.

BACKGROUND OF THE INVENTION

Mobile terminals, such as wireless telephones, generally require that a specified radio frequency (RF) output power be delivered to a radiating antenna. Further, many such systems are required to control the transmitted power to achieve a specific level depending upon signal strength. To meet these requirements, system architectures generally incorporate a closed-loop power control scheme. Typically, this scheme requires sampling the output of a power amplifier to create a signal, which is sent to control circuitry. The control circuitry generates a control signal that adjusts the output power of the amplifier until it is within the specified power level. Such sampling of the output power is disadvantageous in that it increases the insertion loss between the output of the power amplifier and the radiating antenna. Therefore, sampling of the output power increases the required output power from the power amplifier and reduces battery life, which in turn reduces talk and standby time of the mobile terminal.

A common technique for sampling the output power includes the use of a directional coupler on the output of the power amplifier. The power coupled from the main signal path is diode detected to generate a signal proportional to the output voltage delivered to the antenna. Use of directional couplers, however, adds loss to the system, forcing the power amplifier to deliver more power, thereby reducing the battery life. In typical applications, the aforesaid loss is often 5–10% of the power amplifier output power and relates to significant loss in talk and standby time for the mobile terminal.

Another common technique for detecting the output power includes measurement of the current consumed by the power amplifier. This technique is limited to power amplifiers operating in a saturated mode, in which the amplifier DC current is a strong function of the output power. This technique is not applicable to power amplifiers operating in a linear mode, since the amplifier DC current does not change as a function of the output power. For the case of a saturated amplifier, the measured current is directly related to the output power generated by the power amplifier, and is also fed back to the control circuitry. This technique is also disadvantageous due to the loss associated with the current measurement. Current measurement generally requires that a series "dropping" element be added between the associated battery and the power amplifier bias input. The voltage across this element will determine the current entering the power amplifier for a known resistance across the element.

Thus, there remains a need for a new and improved technique for power detection in RF power amplifiers.

SUMMARY OF THE INVENTION

The present invention provides an efficient way to detect the transmit power provided by an amplifier. A power sense signal indicative of the transmit power of the amplifier is generated and fed back to a control system, which will react accordingly to control input signal levels, bias, gain, or a combination thereof for the amplifier in traditional fashion to control transmit power. Detection circuitry representing a scaled version of the amplifier receives the radio frequency (RF) drive in parallel with the amplifier to provide a scaled output signal. The scaled output signal is rectified and filtered to generate the power sense signal.

Accordingly, the present invention includes circuitry including a transistor network, a sense transistor, a rectifier, and an output filter. The transistor network receives and amplifies an RF drive to provide an output signal. The sense transistor receives the RF drive and provides a scaled output signal proportional to the output signal. The sense transistor is proportional to the transistor network, wherein the output signal is a factor A times the scaled output signal. The rectifier receives and rectifies the scaled output signal to provide a rectified signal. The output filter filters the rectified signal to provide a DC voltage proportional to the output power associated with the output signal. Additional circuitry may be provided for temperature, signal level, and process variations.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The present invention relates to an efficient technique for detecting transmit power associated with a power amplifier. The technique may be implemented in numerous embodiments, several of which are discussed in detail below. The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
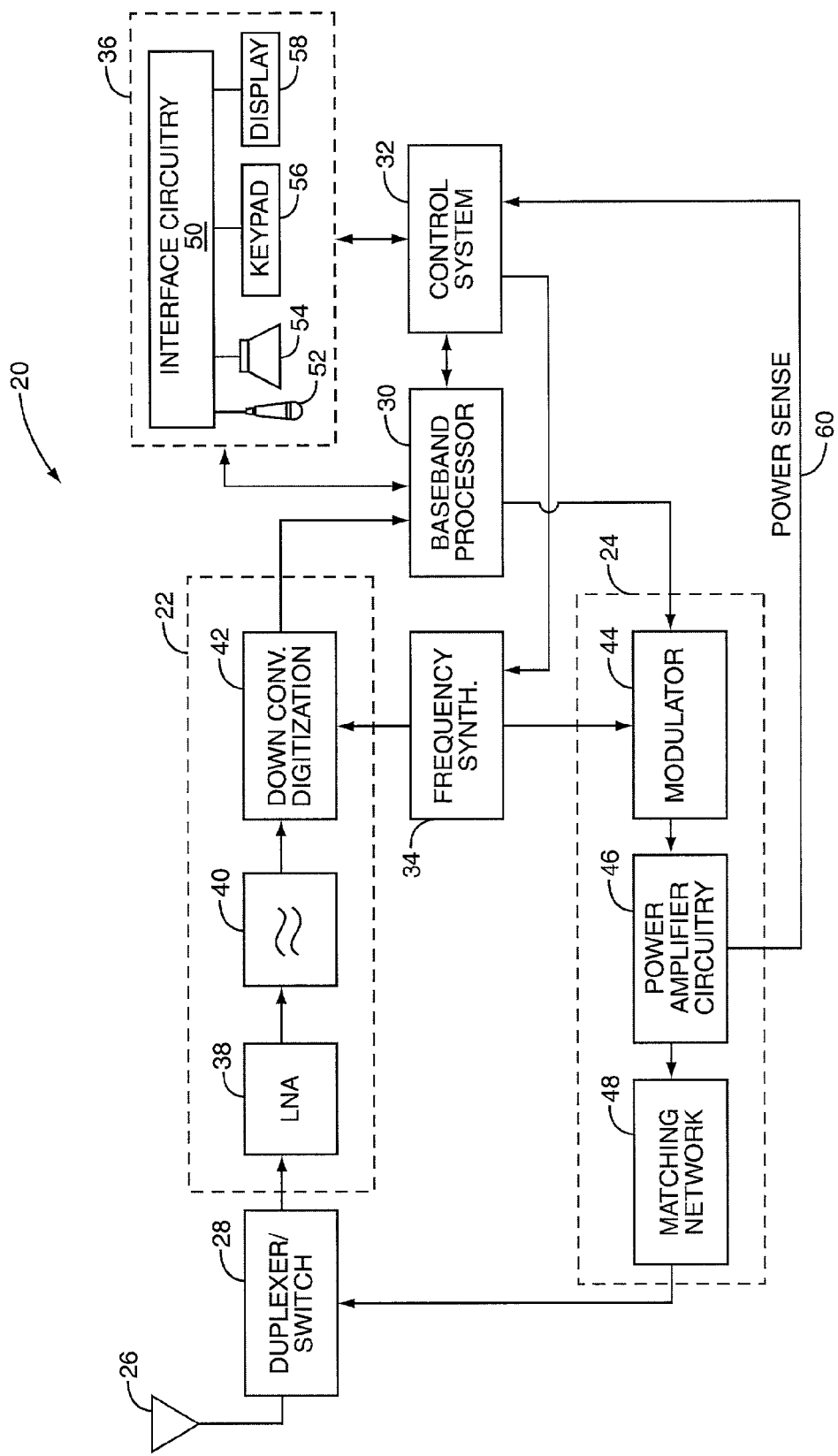
FIG. 1 is a schematic representation of a mobile terminal configured according to one embodiment of the present invention.

The present invention may be incorporated in a mobile terminal 20, such as a mobile telephone, wireless personal digital assistant, or like communication device. The basic architecture of a mobile terminal 20 is represented in FIG. 1 and may include a receiver front end 22, a radio frequency transmitter section 24, an antenna 26, a duplexer or switch 28, a baseband processor 30, a control system 32, a frequency synthesizer 34, and an interface 36. The receiver front end 22 receives information bearing radio frequency signals from one or more remote transmitters provided by a base station. A low noise amplifier 38 amplifies the signal. A filter circuit 40 minimizes broadband interference in the received signal, while downconversion and digitization circuitry 42 downconverts the filtered, received signal to an intermediate or baseband frequency signal, which is then digitized into one or more digital streams. The receiver front end 22 typically uses one or more mixing frequencies generated by the frequency synthesizer 34.

The baseband processor 30 processes the digitized received signal to extract the information or data bits conveyed in the received signal. This processing typically comprises demodulation, decoding, and error correction operations. As such, the baseband processor 30 is generally implemented in one or more digital signal processors (DSPs).

On the transmit side, the baseband processor 30 receives digitized data, which may represent voice, data, or control information, from the control system 32, which it encodes for transmission. The encoded data is output to the transmitter 24, where it is used by a modulator 44 to modulate a carrier signal that is at a desired transmit frequency. Power amplifier circuitry 46 amplifies the modulated carrier signal to a level appropriate for transmission, and delivers the modulated carrier signal to antenna 26 through a matching network 48.

A user may interact with the mobile terminal 20 via the interface 36, which may include interface circuitry 50 associated with a microphone 52, a speaker 54, a keypad 56, and a display 58. The interface circuitry 50 typically includes analog-to-digital converters, digital-to-analog converters, amplifiers, and the like. Additionally, it may include a voice encoder/decoder, in which case it may communicate directly with the baseband processor 30.

The microphone 52 will typically convert audio input, such as the user's voice, into an electrical signal, which is then digitized and passed directly or indirectly to the baseband processor 30. Audio information encoded in the received signal is recovered by the baseband processor 30, and converted by the interface circuitry 50 into an analog signal suitable for driving speaker 54. The keypad 56 and display 58 enable the user to interact with the mobile terminal 20, input numbers to be dialed, address book information, or the like, as well as monitor call progress information.

As noted, the present invention provides an efficient way to detect the transmit power provided by the power amplifier circuitry 46. Typically, a signal indicative of transmit power, referred to as power sense (POWER SENSE) 60, is generated in the power amplifier circuitry 46 and fed back to the control system 32, which will react accordingly to control input signal levels, bias, gain, or a combination thereof in traditional fashion to control transmit power.

Figure 2:
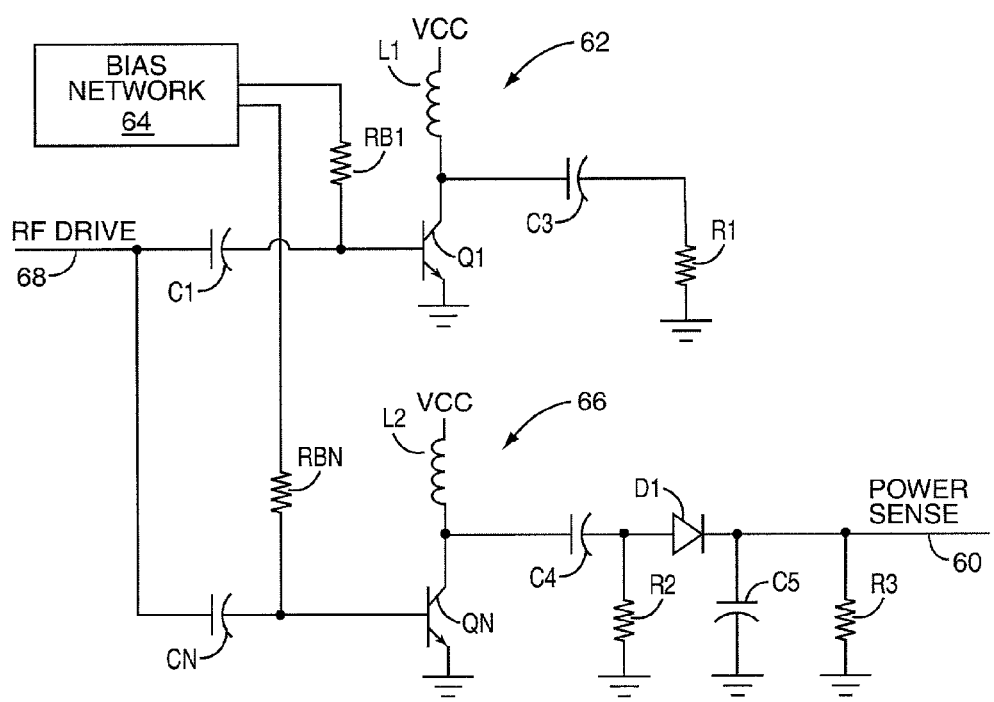
FIG. 2 is a schematic representation of power amplifier circuitry incorporating power detection circuitry according to a first embodiment of the present invention.

As illustrated in FIG. 2, a first embodiment of the present invention includes an amplifier 62, bias network 64, and detector circuitry 66. Preferably, the detector circuitry 66 includes a transistor QN, which is a scaled version of a transistor network forming the output stage of the amplifier 62. The transistor network is represented by the single transistor Q1, bias resistor RB1, and coupling capacitor C1. The bias network is configured to deliver bias through bias resistor RB1 to the base of transistor (network) Q1. The radio frequency (RF) drive 68 is coupled to the base of transistor (network) Q1 through capacitor C1. The transistor (network) Q1 will amplify the RF drive 68 in light of the bias provided by bias network 64 to create an output signal, which is delivered through capacitor C3 to an output load R1. The capacitor C3 could be replaced by the output matching network 48 and the output load R1 represents the load impedance of the antenna 26. The transistor (network) Q1 is coupled to a voltage source (VCC) through inductor L1.

The detector circuitry 66 is a scaled version of the amplifier 62 and is configured to include a transistor QN receiving bias from the bias network 64 through resistor RBN and RF drive 68 through capacitor CN. The transistor QN is coupled to voltage source VCC through inductor L2. The detector circuitry 66 receives the RF drive 68 and bias from the bias network 64 and creates a scaled output signal, which is a scaled version of the output signal generated by the amplifier 62, at the collector of transistor QN.

Diode D1 rectifies the scaled output signal, and capacitor C5 and resistor R3 filter the rectified signal to create a power sense signal 60 proportional to the transmit power associated with the output signal of the amplifier 62. In operation, capacitor C4 and resistor R2 represent the RF load impedance for the transistor QN, and this impedance is a scaled replica of the RF load impedance presented to the transistor (network) Q1 by capacitor C3 and resistor R1. Capacitor C5 filters RF from the power sense signal 60, and resistor R3, the load resistance of the detector, is selected to set the level of the power sense signal 60.

For proper scaling, the power output capability of transistor QN of the detector network 66 is proportionally less than that of the transistor (network) Q1. Preferably, the emitter area associated with transistor QN relates to the total emitter area of the transistor (network) Q1 by a scaling ratio A. Since the size of Q1 and QN differ by the scaling ratio A, the input and output impedances of the two transistors differ by the scaling ratio A. This in turn will cause that the RF drive 68 will be proportionally divided between the two transistors Q1 and QN. The RF drive delivered to the transistor QN will be $1/(A+1)$ times the total RF drive 68. The bias provided to the transistor (network) Q1 and the transistor QN of the detector circuitry 66 is set such that the scaled output signal of the detector circuitry 66 relates to the output signal of the amplifier 62 by factor of A.

For a given scaling ratio A, the total emitter area, or device size, for transistor (network) Q1 equals A times the emitter area for transistor QN. Accordingly, capacitor C1 equals A times the capacitance of capacitor CN, and the value of resistor R1 equals the resistance of resistor R2 divided by A. The scaling ratio chosen is not critical, as long as the above equations are met. For example, the detector circuitry 66 has been fabricated for applications at 900 MHz and 1800 MHz, and scaling ratios of 144, 72 and 48 have been used.

Figure 3:
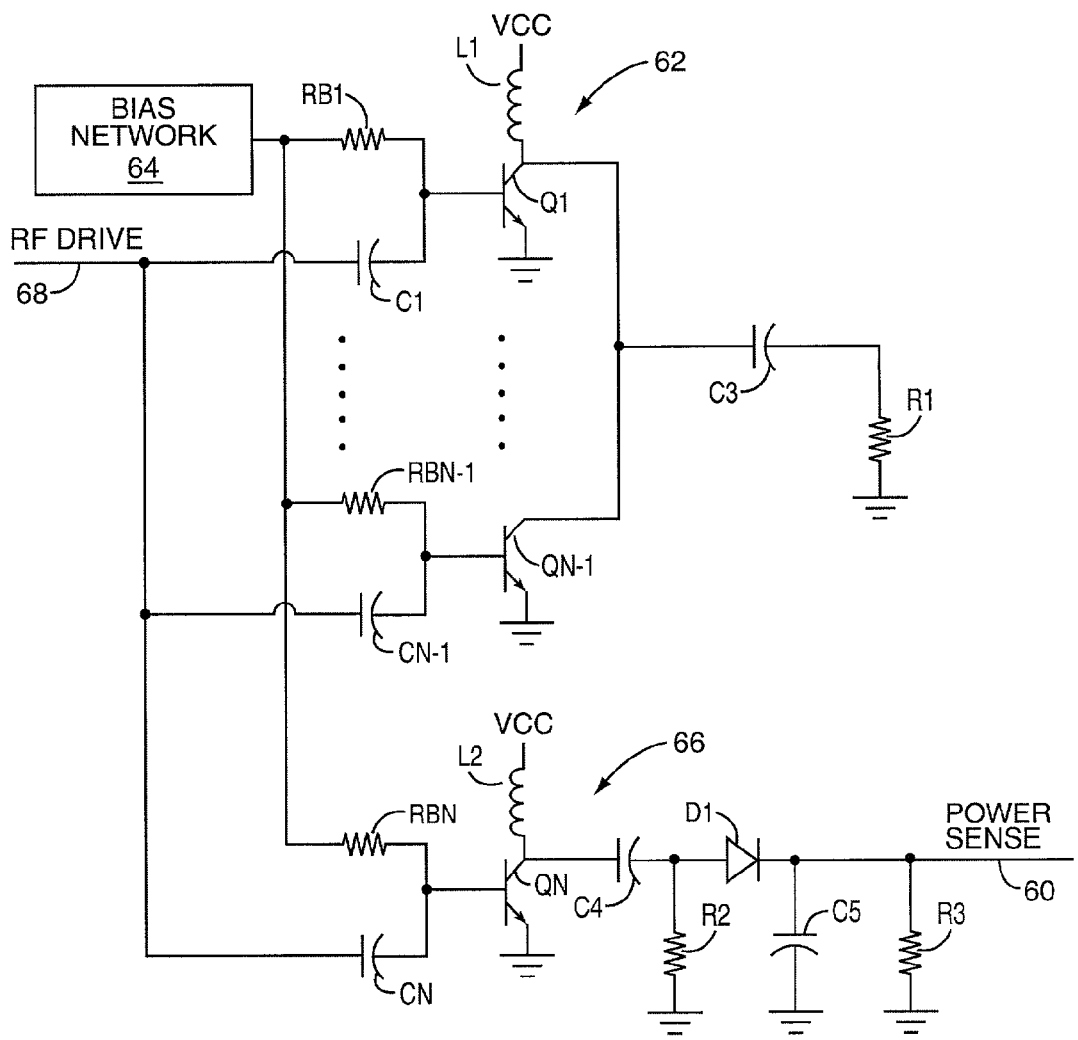
FIG. 3 is a more detailed schematic representation of the power amplifier circuitry of the first embodiment of the present invention.

As illustrated in FIG. 3, the transistor (network) Q1 and the transistor QN of the detector circuit may be provided by an array of identical transistors Q1 through QN wherein transistors Q1 through QN−1 are used in the amplifier 62 and a single transistor QN is used in the diode detector circuitry 66. In this configuration, each transistor Q1 through QN receives identical bias from the bias network 64 through resistors RB1 through RBN and RF drive 68 through capacitors C1 through CN. Notably, the collectors of transistors Q1 through QN−1 are coupled together to provide a common output signal to capacitor C3 and load Rl, which represent the matching network 48 and the load of antenna 26. The collector of transistor QN is coupled to capacitor C4 of the detector circuitry 66 instead of the other collectors of transistors Q1 through QN−1. The signals at the collectors of transistors Q1 through QN−1 are combined to form an output signal A times that of the scaled output signal provided by transistor QN, assuming that A equals one less than the total number of transistors, or N−1. The transistors Q1 through QN are preferably heterojunction bipolar transistors (HBTs) formed on a single semiconductor and equally sized to form a transistor array. However, the inventive concepts defined herein are independent of technology (Si, GaAs, SiGe, etc.) as well as device type (BJT, FET, MESFET, HBT, etc.). For the invention to be implemented on a single integrated circuit, the technology in which the invention is implement should have both amplifying elements and a detector element, such as diode D1. Preferably, the amplifying elements are GaAs HBT devices, and the detector element is a GaAs Schottky diode.

Further information pertaining to the transistor array illustrated in FIG. 3 may be found in U.S. Pat. No. 5,608,353, HBT POWER AMPLIFIER, issued Mar. 4, 1997; and U.S. Pat. No. 5,629,648, HBT POWER AMPLIFIER, issued May 13, 1997, which are assigned to RF Micro Devices, Inc. of 7628 Thorndike Road, Greensboro, N.C. 27409, and wherein the disclosures are incorporated herein by reference in their entirety. Exemplary bias networks 64 capable of being used in association with the present invention are described in further detail in U.S. patent application Ser. No. 09/467,415, entitled BIAS NETWORK FOR HIGH EFFICIENCY RF LINEAR POWER AMPLIFIER, filed Dec. 20, 1999, currently pending, the disclosure of which is incorporated herein by reference in its entirety. Upon understanding the present invention, those skilled in the art will be able to construct any number of bias networks that are compatible with the present invention.

Figure 4:
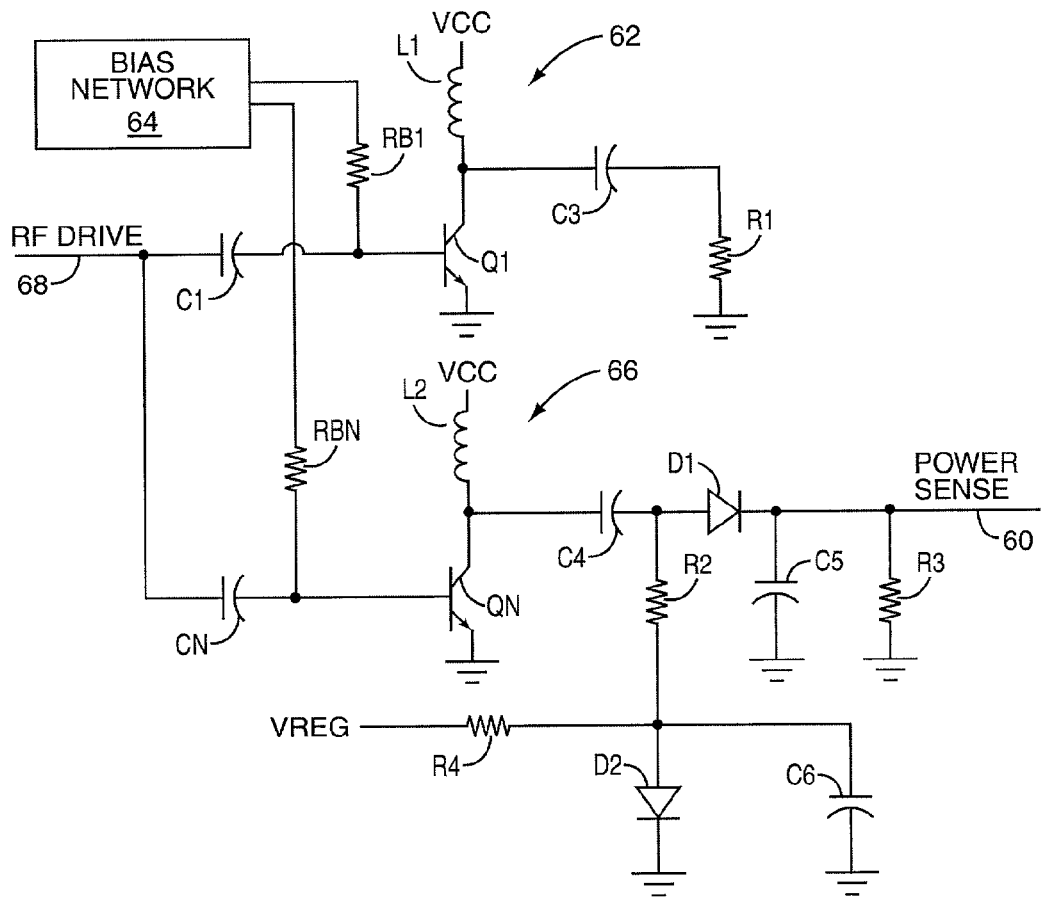
FIG. 4 is a schematic representation of power amplifier circuitry incorporating power detection circuitry according to a second embodiment of the present invention.

In order to improve the low power performance and dynamic range of the detector circuitry 66, a small amount of bias current can be applied to diode D1. An exemplary embodiment is illustrated in FIG. 4. The anode of diode D2 is connected to resistor R2. The cathode of diode D2 is connected to ground. Further, a regulated voltage (VREG) is provided to drive resistor R4 to provide current through diode D2, which establishes the voltage appearing at the anode of D2. In this way, diode D2 functions as a voltage source from which a variable amount of DC current may be drawn by the rectifier diode D1. For example, resistor R4 and diode D2 may by selected such that approximately 15 µA of current flow through D1 with no RF present in the circuit. The size of the diode D2 may be adjusted in order to adjust the voltage appearing at the anode of D2. In practice, diode D2 may be composed of 8 or 16 parallel diodes. The paralleling of many diodes lowers the voltage appearing at the anode of diode D2. The voltage at the anode of diode D2 is between 0.5 V and 0.6 V. Approximately 1 mA of quiescent current flows through resistor R4 and diode D2 to ground.

The use of a diode voltage source to supply the bias current for the rectifier diode D1 provides temperature and process stability to reduce circuit performance variations due to temperature and diode manufacturing process variations. At higher temperatures, the diode potential drop from anode to cathode for a given diode current decreases. If the bias voltage source, represented by diode D2, were instead a constant voltage source not varying with temperature, then an increase in temperature would result in an increase in the DC voltage appearing at R3 (all other things being equal), since the voltage at R3 is equal to the voltage at D2 minus the potential drop across R2 and D1. However, the use of a second diode D2 as the bias voltage source will provide a temperature compensating effect, since at higher temperatures the voltage appearing at the anode of D2 will be reduced in a similar amount to the reduction in the D1 potential drop due to temperature. Such a configuration also minimizes variations in circuit performance due to variations in the diode manufacturing process. Capacitor C6 is an RF bypass used to ensure that the RF load impedance of QN, represented by resistor R2, does not substantially change with the addition of the bias circuitry R4 and D2.

Figure 5:
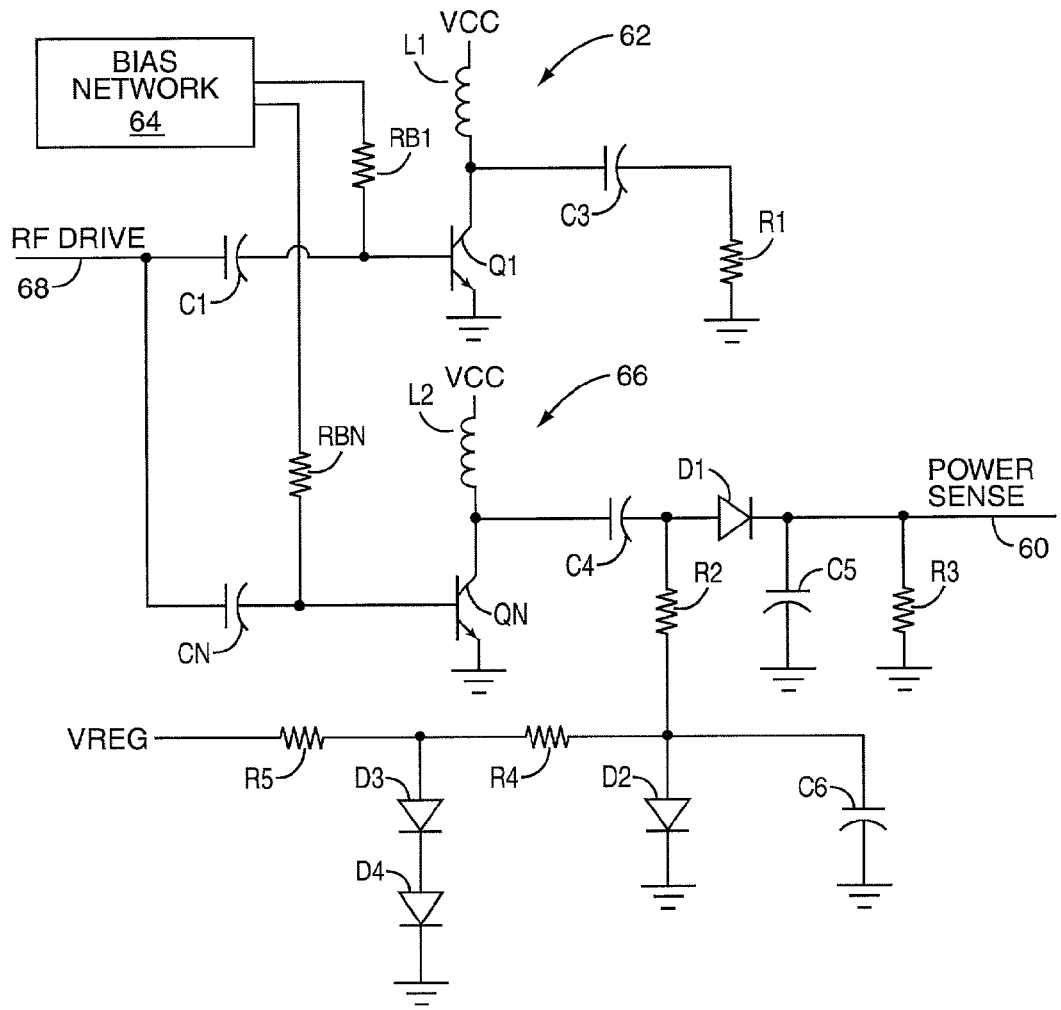
FIG. 5 is a schematic representation of power amplifier circuitry incorporating power detection circuitry according to a third embodiment of the present invention.

As illustrated in FIG. 5, additional circuitry may be provided to reduce the impact of variations in VREG on the power sense signal 60. In this circuit, resistor R5 is added in series with resistor R4, and diodes D3 and D4 are coupled between resistors R4 and R5 and ground. In operation, the voltage drop across diodes D3 and D4 remains stable as VREG varies, thus causing the voltage at the anode of diode D2 to remain more constant as VREG varies.

Figure 6:
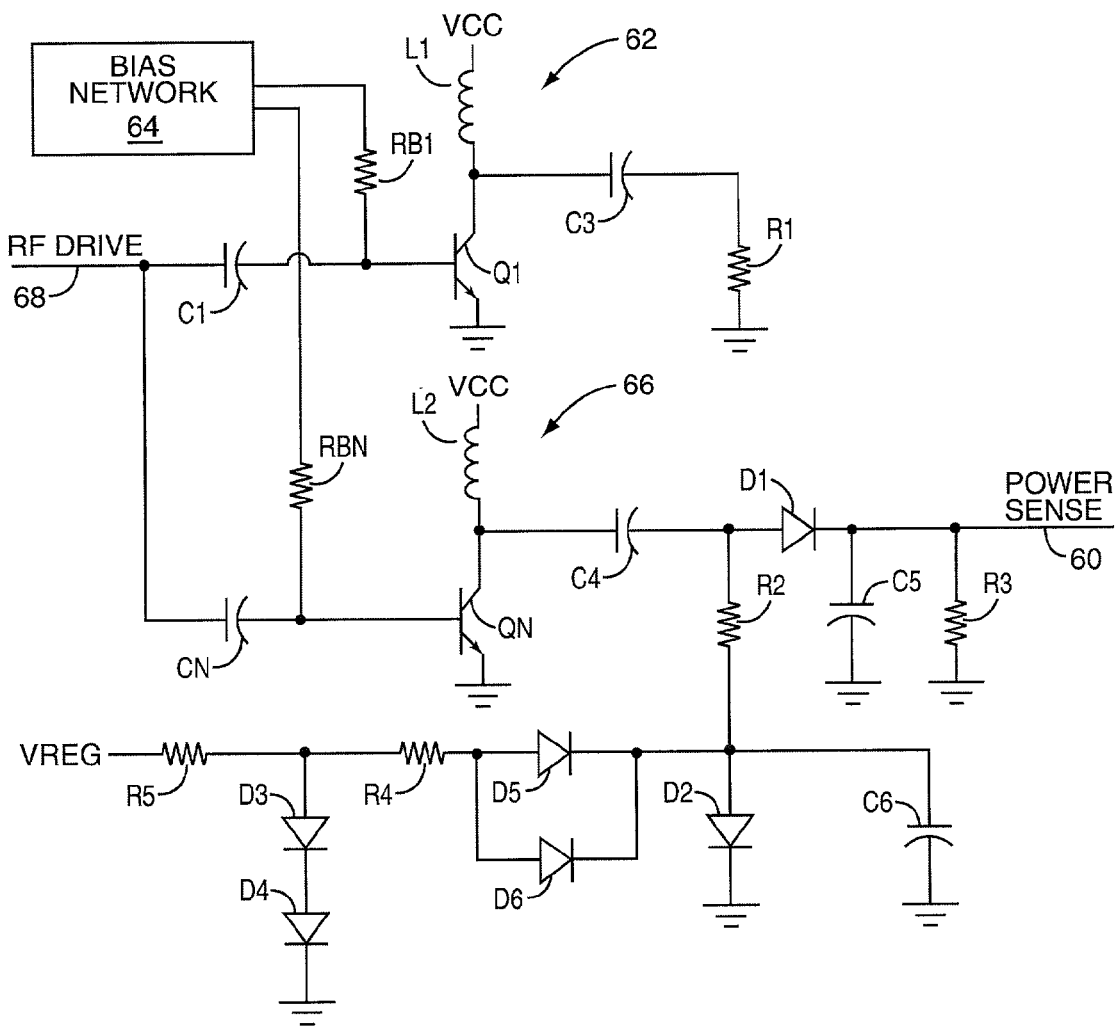
FIG. 6 is a schematic representation of power amplifier circuitry incorporating power detection circuitry according to a fourth embodiment of the present invention.

Another circuit modification, as illustrated in FIG. 6, is directed to reduce variations resulting from the voltage at the anode of diode D2 varying as a function of the RF power detected. As the RF power of the scaled output signal delivered to resistor R2 increases, the DC current flowing through resistor R2, diode D1 and resistor R3 likewise increases because diode D1 is rectifying the AC signal appearing at the anode of diode D1. As a result, the power sense signal 60 voltage appearing at resistor R3 increases as the RF power delivered to resistor R2 increases. Since diode D2 is acting as the voltage source from which the DC current is supplied, and since diode D2 is not an ideal voltage source, when additional DC current is drawn, the voltage across D2 collapses slightly.

The reduction of the voltage at the anode of diode D2 will cause a slight increase of the voltage across diodes D5 and D6, assuming that the voltage appearing at the anode of D3 were to remain constant. The slight increase in voltage will result in an increase in the current through diodes D5 and D6, which in turn leads to a reduction in the effective resistance of diodes D5 and D6. Thus, diodes D5 and D6 function as a nonlinear resistance, the value of the resistance decreasing with increasing current flow through the diodes, and this keeps the voltage at diode D2 more stable as a function of the variable current drawn from the diode D2 source, which fluctuates as a function of the RF power delivered to resistor R2. For example, the current drawn from the diode D2 source may vary from 15 µA with no RF present at resistor R2 to approximately 300–500 µA with maximum RF present at resistor R2, which is approximately 15 dBm. The circuit shown in FIG. 6 has achieved accuracy better than +/−0.2 dB.

In the embodiment illustrated in FIG. 6, VREG is nominally 2.75 volts, the voltage across resistor R3 may vary from 50 mV with no RF present at resistor R2 to approximately 2.2 volts with 15 dBm present at resistor R2. The output signal delivered to the load R1 is typically between 31 dBm to 34 dBm.

Notably, the embodiments illustrated herein will likely include additional components when implemented. Only the basic architectures were illustrated for the sake of conciseness and clarity. Those skilled in the art will recognize improvements and modifications to the preferred embodiments of the present invention. All such improvements and modifications are considered within the scope of the concepts disclosed herein and the claims that follow.

What is claimed is:

1. A circuit comprising:
   a) a transistor network configured to receive and amplify an RF drive to provide an output signal;
   b) a sense transistor configured to receive the RF drive and provide a scaled output signal proportional to the output signal, the sense transistor proportional to the transistor network wherein the output signal is a factor A times the scaled output signal;
   c) a rectifier adapted to receive and rectify the scaled output signal to provide a rectified signal;
   d) an output filter adapted to filter the rectified signal to provide a DC power sense signal proportional to an output power associated with the output signal, such that amplification of the transistor network is based on the DC power sense signal; and
   e) wherein the transistor network and the sense transistor are formed from an array of N parallel transistors such that outputs of N-1 of the parallel transistors are coupled together to form an amplifier output providing the output signal and one of the parallel transistors forms the sense transistor providing the sealed output signal.

2. The circuit of claim 1 wherein the rectifier includes a first diode in series with the filter to half-wave rectify the scaled output signal.

3. The circuit of claim 2 further comprising a capacitor in series with the first diode and a first resistor is coupled between the anode of the first diode to an anode of a second diode, which is coupled to ground, the anode of the second diode being coupled to a voltage source via a second resistor to provide a bias current for the first and second diodes.

4. The circuit of claim 3 further comprising a plurality of diodes in parallel with the second diode.

5. The circuit of claim 3 wherein a third resistor is in series between the second resistor and the voltage source, and at least two series diodes are placed between ground and a point between the second and third resistors to minimize the impact of variations in the voltage source.

6. The circuit of claim 5 wherein at least two parallel diodes are placed in series between the anode of the second diode and the second resistor.

7. The circuit of claim 1 wherein the RF drive is applied equally to each of the N parallel transistors.

8. The circuit of claim 7 wherein bias is provided from a bias network equally to each of the N parallel transistors.

9. The circuit of claim 1 wherein the RF drive is equally applied through separate capacitors coupled to a base of each of the N parallel transistors and bias is equally applied through separate base resistors to the base of each of the N parallel transistors.

10. The circuit of claim 9 further including a bias network to generate the bias applied to each of the plurality of N transistors.

11. The circuit of claim 1 wherein the total emitter area of the transistor network is a factor A times the emitter area of the sense transistor.

12. The circuit of claim 1 wherein an amount of the RF drive received by the sense transistor is a factor $1/(A+1)$ times the RF drive.

13. The circuit of claim 1 wherein the array of N parallel transistors are identical transistors.

14. The circuit of claim 1 wherein the array of N parallel transistors are formed on a single semiconductor.

15. The circuit of claim 1 wherein the outputs of N-1 of the parallel transistors are collector outputs.

16. A mobile terminal comprising:
   a) modulation circuitry for creating a modulated signal;
   b) amplifier circuitry for:
      i) amplifying the modulated signal to an output signal for transmission at a desired power level, and
      ii) generating a power sense signal indicative of actual output power associated with the output signal; and
   c) a control system for controlling the amplifier circuitry to amplify the modulated signal as a function of the power sense signal, the amplifier circuitry comprising:
      i) a transistor network configured to receive and amplify an RF drive to provide the output signal;
      ii) a sense transistor configured to receive the RE chive and provide a scaled output signal proportional to the output signal, the sense transistor proportional to the transistor network wherein the output signal is a factor A times the scaled output signal;
      iii) a rectifier adapted to receive and rectify the scaled output signal to provide a rectified signal;
      iv) an output filter adapted to filter the rectified signal to provide a DC signal, which represents the power sense signal and is proportional to the output power associated with the output signal; and
      v) wherein the transistor network and the sense transistor are formed from an array of N parallel transistors such that outputs of N-1 of the parallel transistors are coupled together to form an amplifier output providing the output signal and one of the parallel transistors forms the sense transistor providing the scaled output signal.

17. The mobile terminal of claim 16 wherein the rectifier includes a first diode in series with the output filter to half-wave rectify the scaled output signal.

18. The mobile terminal of claim 17 wherein further comprising a capacitor in series with the first diode and a first resistor is coupled between the anode of the first diode to an anode of a second diode, which is coupled to ground, the anode of the second diode being coupled to a voltage source via a second resistor to provide a bias current for the first and second diodes.

19. The mobile terminal of claim 18 further comprising a plurality of diodes in parallel with the second diode.

20. The mobile terminal of claim 18 wherein a third resistor is in series between the second resistor and the voltage source, and at least two series diodes are placed between ground and a point between the second and third resistors to minimize the impact of variations in the voltage source.

21. The mobile terminal of claim 20 wherein at least two parallel diodes are placed in series between the anode of the second diode and the second resistor.

22. The mobile terminal of claim 16 wherein the RF drive is applied equally to each of the N parallel transistors.

23. The mobile terminal of claim 22 wherein bias is provided from a bias network equally to each of the N parallel transistors.

24. The mobile terminal of claim 16 wherein the RF drive is equally applied through separate capacitors coupled to a base of each of the N parallel transistors and bias is equally applied through separate base resistors to the base of each of the N parallel transistors.

25. The mobile terminal of claim 24 further including a bias network to generate the bias applied to each of the N parallel transistors.

26. The mobile terminal of claim 16 wherein the total emitter area of the transistor network is a factor A times the emitter area of the sense transistor.

27. The mobile terminal of claim 16 wherein an amount of the RF drive received by the sense transistor is a factor $1/(A+1)$ times the RF drive.

28. The mobile terminal of claim 16 wherein the array of N parallel transistors are identical transistors.

29. The mobile terminal of claim 16 wherein the array of N parallel transistors are formed on a single semiconductor.

30. The mobile terminal of claim 16 wherein the outputs of N−1 of the parallel transistors are collector outputs.

* * * * *